United States Patent
Saucy

(10) Patent No.: US 8,025,782 B2
(45) Date of Patent: Sep. 27, 2011

(54) PROCESS FOR FABRICATING A MONOLAYER OR MULTILAYER METAL STRUCTURE IN LIGA TECHNOLOGY, AND STRUCTURE OBTAINED

(75) Inventor: Clément Saucy, La Neuveville (CH)

(73) Assignee: Doniar SA, Bienne (CH)

( * ) Notice: Subject to any disclaimer, the term of this patent is extended or adjusted under 35 U.S.C. 154(b) by 838 days.

(21) Appl. No.: 11/717,773

(22) Filed: Mar. 14, 2007

(65) Prior Publication Data
US 2007/0227893 A1   Oct. 4, 2007

(30) Foreign Application Priority Data
Mar. 15, 2006   (EP) .................................. 06405114

(51) Int. Cl.
*C25D 1/00* (2006.01)
(52) U.S. Cl. .......................................... 205/67; 205/70
(58) Field of Classification Search .................. 205/67, 205/70, 118, 222
See application file for complete search history.

(56) References Cited

U.S. PATENT DOCUMENTS

| | | | | | |
|---|---|---|---|---|---|
| 2,995,443 | A | * | 8/1961 | Kempe | 430/323 |
| 4,394,341 | A | * | 7/1983 | Wierschke | 264/225 |
| 4,651,174 | A | * | 3/1987 | Bava et al. | 347/47 |
| 4,844,778 | A | * | 7/1989 | Witte | 205/75 |
| 5,766,441 | A | | 6/1998 | Arndt et al. | |
| 5,826,516 | A | * | 10/1998 | Shimazu et al. | 101/483 |
| 5,899,390 | A | | 5/1999 | Arndt et al. | |
| 6,027,630 | A | * | 2/2000 | Cohen | 205/135 |
| 6,350,360 | B1 | * | 2/2002 | Bonivert et al. | 205/67 |
| 6,627,388 | B2 | * | 9/2003 | Lin et al. | 430/315 |
| 7,105,280 | B1 | * | 9/2006 | Deeman et al. | 430/320 |
| 2003/0062652 | A1 | | 4/2003 | Lee et al. | |
| 2005/0056074 | A1 | | 3/2005 | Meng | |
| 2005/0103635 | A1 | * | 5/2005 | Arai et al. | 205/74 |

FOREIGN PATENT DOCUMENTS

| | | |
|---|---|---|
| CN | 1145656 A | 3/1997 |
| CN | 1268585 A | 10/2000 |
| CN | 1583543 A | 2/2005 |
| EP | 0 851 295 A1 | 7/1998 |
| EP | 1 331 528 A2 | 7/2003 |
| EP | 1 596 259 A | 11/2005 |

OTHER PUBLICATIONS

Frazier et al. ("Metallic microstructures fabricated using photosensitive polyimide electroplating molds," J. Microelectromech. Syst. 2 (1993), pp. 87-94).*
Search Report of Corresponding European Patent Application No. 06 40 5114 dated Oct. 12, 2006.

(Continued)

*Primary Examiner* — Luan V Van
(74) *Attorney, Agent, or Firm* — Westerman, Hattori, Daniels & Adrian, LLP

(57) ABSTRACT

The invention relates to a process for fabricating a monolayer or multilayer metal structure in LIGA technology, in which a photoresist layer is deposited on a flat metal substrate, a photoresist mold is created by irradiation or electron or ion bombardment, a metal or alloy is electroplated in this mold, the electroformed metal structure is detached from the substrate and the photoresist is separated from this metal structure, wherein the metal substrate is used as an agent involved in the forming of at least one surface of the metal structure other than that formed by the plane surface of the substrate.

21 Claims, 6 Drawing Sheets

OTHER PUBLICATIONS

Das S. S. et al., "Adhesion Promotion by Surface-modification at the PMMA-metal Interface for LIGA-type Processing", Microelectromechanical Structures for Materials Research Symposium, Materials Research Society, Warrendale, PA, USA, 1998, vol. 518, pp. 149-154.

* cited by examiner

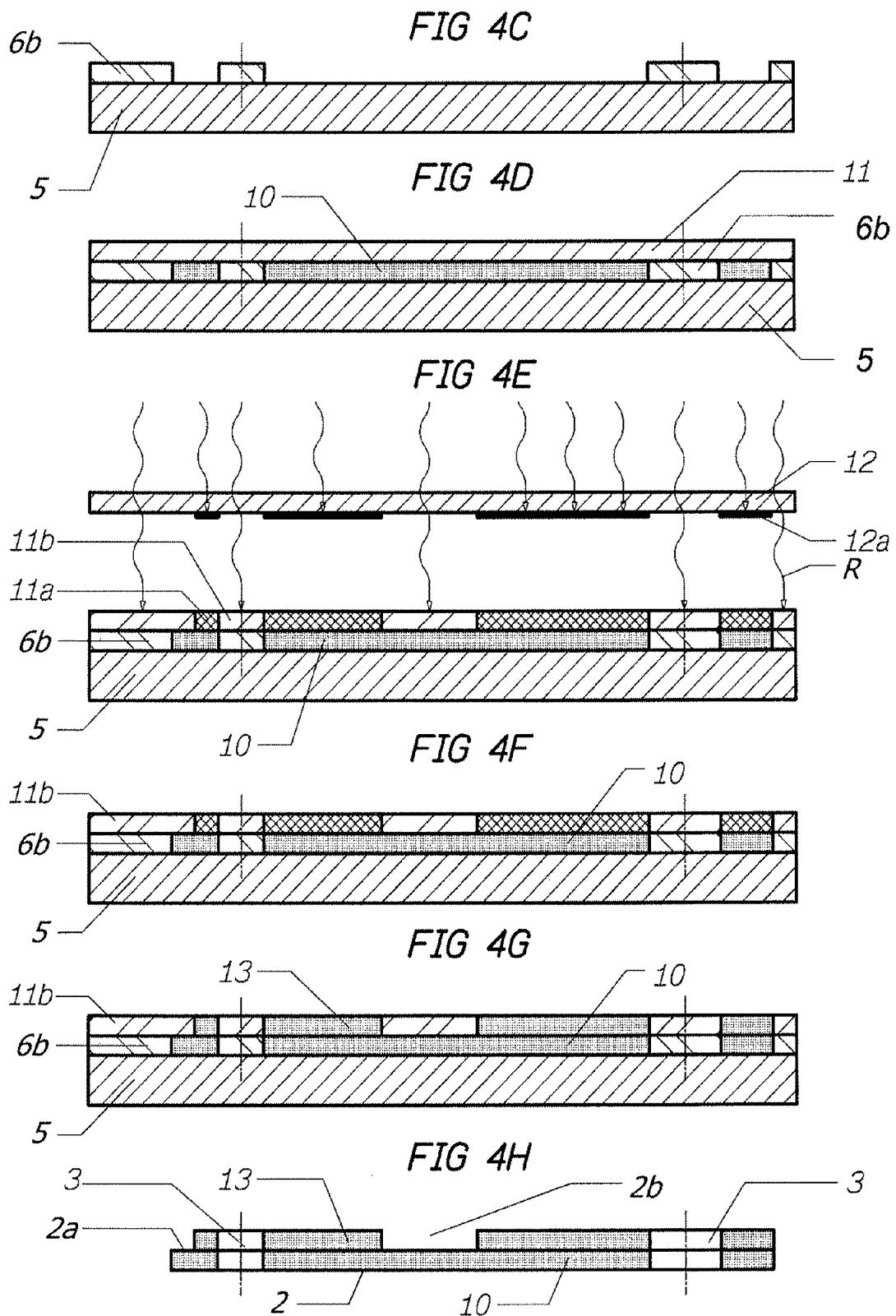

PROCESS FOR FABRICATING A MONOLAYER OR MULTILAYER METAL STRUCTURE IN LIGA TECHNOLOGY, AND STRUCTURE OBTAINED

The present invention relates to a process for fabricating a monolayer or multilayer structure in LIGA technology, and to a novel monolayer or multilayer metal structure that can be obtained by this process.

DGC Mitteilungen No. 104, 2005 mentions the use of the technology called LIGA (Lithographie Galvanik Abformung [Lithography, Electroforming, Molding], a method devised by W. Ehrfeld of the Karlsruhe Nuclear Research Center, Germany) for the fabrication of high-precision metal parts for timepieces, such as for example anchors or escapement wheels. This process has the drawback of requiring expensive equipment, namely a synchrotron, to generate the X-ray irradiation. It therefore cannot be widely used in the watchmaking industry.

A. B. Frazier et al., Journal of Microelectromechanical Systems, 2, 2, June 1993, describes the fabrication of metal structures by electrodeposition of metal in molds made of a polyimide-based photoresist, these being produced by means of a process using a technology called UV-LIGA, similar to the LIGA technology but with UV illumination instead of irradiation with X-rays.

The process used for fabricating monolayer metal structures comprises the following steps:
creation on a silicon support wafer of a sacrificial metal layer and a seed layer for the electrodeposition;
deposition of a photosensitive polyimide layer by spin coating;
UV illumination through a mask corresponding to the desired impression;
development, by dissolving the nonirradiated parts so as to obtain a polyimide mold;
electrodeposition of nickel or copper in the open part of the mold up to the height thereof; and
removal of the sacrificial layer and separation from the support wafer of the metal structure obtained by electroforming, and removal of the polyimide mold.

That document describes monolayer metal structures such as copper or nickel gearwheels manufactured using this process (cf. A) and B) pp. 89-91 and FIGS. 3-7).

Frazier et al. also discloses a process for fabricating bilayer metal structures, comprising the following steps:
creation on a silicon support wafer of a sacrificial metal layer and a seed layer for the electrodeposition;
deposition of a photosensitive polyimide layer by spin coating;
illumination with ultraviolet rays through a mask corresponding to the desired impression;
development, by dissolving the nonirradiated parts so as to obtain a polyimide mold;
electrodeposition of nickel in the open part of the mold up to the height of the latter, so as to obtain a substantially plane upper surface;
vacuum vapor deposition of a thin chromium layer;
deposition of a photosensitive polyimide layer on this thin chromium layer by spin coating and removal of the thin chromium layer using a hydrochloric acid solution;
UV illumination through a new mask corresponding to the desired impression, development, by dissolving the nonirradiated parts so as to obtain a new polyimide mold, and electrodeposition of nickel in the open part of the mold; and
removal of the sacrificial layer, separation of the metal structure obtained by electrodeposition from the support wafer and removal of the polyimide mold.

That document describes the use of this process for fabricating a metal plate surmounted by a protuberance of parallelepipedal general shape (V. and FIG. 9, page 92), the second layer being entirely superposed on the larger-area first layer.

The processes described by Frazier et al. do not allow machining operations to be carried out on the fabricated structures before they have been detached from the silicon support wafer. This is because the support wafer is too fragile to withstand the mechanical forces generated by machining. If a machining operation is necessary, it requires each fabricated metal structure to be precisely positioned and immobilized. This makes the fabrication complicated and difficult to implement.

EP 0 851 295 discloses another UV-LIGA process for fabricating multilayer metal structures, such as a toothed wheel surmounted by a bilayer pinion (example 1) or a trilayer heat flux microsensor (example 3). That process is similar to the one described by Frazier et al. and also has the abovementioned drawbacks.

It has already been proposed in U.S. Pat. No. 5,766,441 to use a copper substrate from 500 μm to 2 mm in thickness, said document specifying that these thicknesses have no influence on the process described. There has also been described, in US 2005/0056074, a LIGA process for fabricating inserts for the compression molding of metals using a stainless steel substrate. These documents do not propose the use of this substrate as a shaping element for at least one surface of the metal structure other than that formed by the plane surface of the substrate.

The object of the invention is to find a process for fabricating a metal structure that does not, have the abovementioned drawbacks and that opens the way to as yet unexplored possibilities in the field of LIGA.

For this purpose, the subject of the present invention is a fabrication process as defined by claim 1.

The Applicant has in fact discovered that the use of a bulk metal substrate, instead of a silicon support wafer covered with a sacrificial metal layer and with a seed layer, makes it possible to machine in situ the structure resulting from the electroforming step before it is detached from the substrate. Thus, it is possible, when fabricating a large number of structures (or parts) on one and the same substrate, for these structures to be machined collectively before they are detached from the substrate when they have been very accurately positioned thereon thanks to the mask used for forming the impressions on the resist layer. The additional step of positioning and immobilizing each structure after detachment from the substrate, for the purpose of subsequent machining, is therefore no longer necessary. Apart from the simplification achieved, this process benefits most particularly from the very great precision in positioning parts on the substrate, something which could no longer be subsequently reproduced to such a degree.

In addition, in the case of the fabrication of multilayer metal structures, the use of a bulk metal support allows leveling by machining (abrasion and polishing) at the end of each electrodeposition step so as to obtain a plane upper surface or the desired thickness. This has the effect of improving the quality of the multilayer metal structure obtained since the subsequent electroplating is performed in a more regular manner and allows better thickness control on a plane surface than on a surface having irregularities.

Thus, as will be observed throughout the description that follows, in the process according to the present invention, the substrate plays the role of an agent involved in the forming of at least one surface of the metal structure other than that formed by the plane surface of the substrate.

The irradiation in such a LIGA process may be X-ray irradiation or UV-ray irradiation, by illumination in normal mode through a mask, by illumination in laser mode, in order to create an array of cured zones, or by laser ablation.

Preferably, the LIGA technology is a UV-LIGA technology, that is to say a LIGA technology using UV irradiation.

The invention relates to a process for fabricating a monolayer machined metal structure in UV-LIGA technology, which comprises the following steps:
a) a bulk metal substrate is coated with a photoresist layer;
b) if necessary, the photoresist layer is heated in order to evaporate the solvent;
c) the photoresist layer is exposed to UV irradiation of 100 to 2000 mJ/cm$^2$ measured at a wavelength of 365 nm, through a mask corresponding to the desired impression;
d) if necessary, in order to complete the photocuring or the photodecomposition, the layer obtained after step c) is annealed;
e) development takes place by dissolving the uncured or photodecomposed parts;
f) a metal or an alloy is electrodeposited in the open parts of the photoresist mold;
g) the electroformed metal structure is leveled by machining, so as to obtain a plane upper surface;
h) if necessary, one or more other machining operations are carried out on the upper face of the electroformed mechanical structure; and
i) the metal structure and the cured photoresist are detached, by delamination, from the bulk metal substrate and the cured photoresist is separated from the machined monolayer metal structure.

The bulk metal substrate is a bulk plate with a thickness in general of 1 to 5 mm, of any shape, for example cylindrical or parallelepipedal, the extent of the upper surface of which is chosen according to the number of structures fabricated on any one substrate, in general from 1 to 5000, in particular from 10 to 3000. This plate is formed from a metal and/or a conducting alloy capable of seeding (starting) the electroforming reaction by acting as cathode. For example, it may consist of copper, brass or stainless steel. Preferably, it consists of stainless steel.

The upper surface of the bulk metal substrate, intended to be in contact with the electrolyte bath, may be polished or textured, for example by micropeening, chemical or mechanical etching or by laser. In the case of etching the metal substrate, it is then possible to obtain at least one surface element in relief resulting from the etching made on said metal substrate. This is absolutely novel, as etched features are always formed by removal of material.

The etching of the substrate is carried out with a mask that is positioned on the metal substrate using the same positioning system as the mask used to form the apertures of the mold defining the shape of the metal structure produced by LIGA. Since the two masks have common positioning references, the etched features formed on the surface of the metal structure may be positioned very precisely with respect to the perimeter of the metal structure produced by electrodeposition.

The bulk metal substrate is degreased and prepared for the electroforming by a suitable treatment. When this substrate consists of stainless steel, a suitable treatment consists for example of an alkaline degreasing step followed by an acid neutralization step, in order to passivate its surface, rinsing with distilled water and drying.

The photoresist is either a negative photoresist, based on a resin that can be cured under the action of UV radiation in the presence of a ptotoinitiator, or a positive photoresist, based on a resin that can decompose under the action of UV radiation in the presence of a ptotoinitiator. The negative photoresist is for example based on an epoxy resin, an isocyanate resin or an acrylic resin. An advantageous epoxy resin is the octofunctional epoxy resin SU-8 (Shell Chemical). It is used in general in the presence of a ptotoinitiator chosen from triarylsulfonium salts, for example those described in U.S. Pat. Nos. 4,058,401 and 4,882,245. The positive photoresist is for example based on a novalac-type phenol-formaldehyde resin in the presence of a DNQ (diazonaphthoquinone) ptotoinitiator.

The photoresist may be deposited by spin coating or by another technique, such as for example dip coating, roll coating, extrusion coating, spray coating, or lamination (for dry films, for example based on an acrylic resin). The preferred coating technique is spin coating.

The maximum photoresist thickness for inducing the desired effect (photocuring or photodecomposition) under the irradiation conditions of step c) is typically 1 mm in the case of UV-LIGA. The thickness of the photoresist layer that can be coated in one application is typically 150 µm, depending on the spin coating technique. The bulk metal substrate will be coated with photoresist one or more times, depending on its desired thickness.

The conditions under which the photoresist is possibly heated, in order to remove the solvent in step b), are chosen according to the nature and the thickness of the photoresist as per the instructions from its manufacturer. For a photoresist based on an SU-8 epoxy resin of 140 µm thickness, step b) consists for example in heating at 65° C. for 5 to 10 minutes and then at 95° C. for 30 to 60 minutes. For a photoresist based on a dry acrylic film, this heating step to evaporate the solvent is unnecessary.

If the photoresist has to be applied several times and if the photoresist has to be heated to evaporate the solvent, step b) will be carried out following step a) after the first application of the photoresist, and steps a) and b) will be repeated the number of times necessary.

Step c) consists in exposing the photoresist layer to UV irradiation of 100 to 2000 mJ/cm$^2$, measured at a wavelength of 365 nm, through a mask corresponding to the desired impression. This irradiation induces photocuring of the resin (negative photoresist) or photodecomposition of the resin (positive photoresist).

Step d) consists, if necessary in order to complete the photocuring or photodecomposition of step c), in annealing the layer obtained after step c).

Step e) consists in developing the structure, by dissolving the nonirradiated parts (negative photoresist) or the irradiated parts (positive photoresist) using a suitable aqueous solution or a solvent, chosen depending on the nature of the photoresist per the instructions from its manufacturer.

Examples of suitable aqueous solutions are weak-based alkaline solutions, for example sodium carbonate solutions, and examples of suitable solvents are GBL (gamma-butyrolactone), PGMEA (propylene glycol methylethyl acetate) and isopropanol. As development solvent or solution, it is advantageous to use PGMEA for an epoxy resin and a 1% sodium carbonate solution or isopropanol for an acrylic resin.

Step f) consists in electrodepositing a metal or an alloy in the open parts of the photoresist mold, up to a defined height equal to or below the height of the photoresist mold using the bulk metal substrate as cathode.

Step g) consists in leveling, by machining, so as to have a plane upper surface. This is made possible by the presence of the bulk metal substrate. This operation also makes it possible to ensure that there is perfect parallelism between the two surfaces of the electrodeposited metal structure.

It is frequent to use, as metal for the electroforming, nickel, copper, gold or silver and, as alloy, a gold-copper, nickel-cobalt, nickel-iron or nickel-manganese alloy. The electroforming conditions, especially the composition of the baths, the geometry of the system, the voltages and the current densities, are chosen for each metal or alloy to be electrodeposited according to the techniques well known in the electroforming art (cf. for example G. A. DiBari, "Electroforming", Electroplating Engineering Handbook, 4th Edition, edited by L. J. Durney, published by Van Nostrand Reinhold Company Inc., New York, USA 1984).

The machining leveling operation is generally carried out by abrasion and polishing, thereby producing a plane upper surface with surface irregularities not exceeding about 1 μm.

Step h) consists, if necessary, in order to obtain the desired structure, in carrying out other machining operations on the upper face of the electroformed mechanical structure, such as for example beveling, etching or decorative machining.

Step i) consists in detaching the machined metal structure from the bulk metal substrate by delamination and in separating the photoresist from the machined metal structure. Before separating the photoresist, etching, surface-treatment and mechanical or laser marking operations may where appropriate be carried out on the detached metal structure.

The lower face of the metal structure detached by delamination from the upper face of the bulk metal substrate reproduces the surface finish of this upper face. Thus, it will either be textured (if the upper face of the metal substrate is textured, for example by etching or micropeening) or have a polished appearance, polished to the desired degree of polishing (if the upper face of the metal substrate has been polished to the desired degree of polish). In the latter case, to the naked eye, the polished appearance of the surface of the lower face of the structure cannot be distinguished from the polished appearance obtained, where appropriate, by polishing the surface of the upper face. When examined under an optical microscope with a magnification of 50 times, with suitable illumination and a certain orientation, or under a scanning electron microscope, or using topographic surface analysis systems, a distinction can however be made between these two surfaces.

The separation or stripping of the cured photoresist from the machined mechanical structure generally takes place by chemical etching or by a plasma treatment. In this way, the machined metal structure is freed.

The process according to the invention for fabricating a monolayer metal structure on a bulk metal substrate has many advantages over the known processes for fabricating such structures on a silicon support wafer.

Firstly, it allows any machining operation to be carried out on the upper surface of the structure obtained after electroforming, before detachment of the substrate and separation of the cured photoresist mold, especially its leveling by abrasion and optionally polishing so as to obtain a plane surface parallel to the surface of the substrate, and one or more other machining operations such as, for example, beveling, etching or decorative machining. Thus, when fabricating a large number of structures (or parts) on one and the same substrate, it is possible for these structures, positioned and immobilized on said substrate, to be machined collectively, thus benefiting in the case of this machining, from the positioning and immobilization on extremely precise cured photoresist molds, carried out during execution of the UV-LIGA technique. It is very difficult, if not impossible, to obtain such precision in positioning and immobilizing each metal structure after it has been detached from the substrate.

The process of the invention may be used to fabricate monolayer metal structures that include an object inserted with extremely precise positioning thereof.

This is because it is possible, after having carried out steps a) to e), to place a removable fastened object on top of the bulk metal substrate and, when detaching the electroformed metal structure from the bulk metal substrate by delamination, to free this object from the bulk metal substrate. For example, the object may be a jewel, such as a bearing ruby of a watch geartrain. The fact of using a bulk metal substrate allows this bearing to be positioned very precisely by means of a peg that is calibrated to the diameter of the opening for guiding the bearing and is fastened in the substrate, projecting from its surface, so as to allow it to be engaged in the opening for guiding the bearing, a short distance from its surface. During step f), this bearing may be held captive in the electroformed metal or alloy that surrounds it. Upon releasing the electroformed structure from the bulk metal substrate during step i), an electroformed structure that includes an inserted object (or insert) is thus obtained.

The precise positioning and removable attachment of an object is not possible on top of a silicon support wafer covered with a sacrificial metal layer and with a seed layer. The known processes for fabricating monolayer metal structures by UV-LIGA use such a wafer and therefore do not allow an object to be inserted into the electroformed metal structure.

The invention therefore also relates to a novel monolayer machined metal structure that includes an inserted object, which structure can be obtained by the process defined above.

The process of the invention also allows the manufacture of monolayer metal structures that include a precisely positioned threaded hole.

This is because it is possible, after having carried out steps a) to e), to place a screw 3 in a tapped hole in the bulk metal substrate 1 by making this screw 3 project beyond the upper surface of the substrate (cf. FIGS. 5A, 5B) and to unscrew this screw from the bulk metal substrate before the metal substrate is detached by delamination. The screw consists of an inert material that does not bond to the electroformed metal, for example Teflon® (PTFE). Below the point where it is desired to position the threaded hole, a threaded hole is tapped in the bulk metal substrate 1 so as to pass vertically through it and a screw 3 is introduced into said hole from below (cf. FIGS. 5A, 5B), part of said screw projecting above the substrate. During step f), the metal or alloy will surround that part of the screw projecting from the bulk metal substrate. Before step i), this screw is unscrewed from the bulk metal substrate. Depending on the length of this screw, it is possible to have either a blind tapping (FIG. 5A) or a through-tapping (FIG. 5B).

It is not possible to tap into a silicon support wafer as it is too brittle and would break. The known processes for fabricating monolayer metal structures by UV-LIGA use such a wafer: they therefore do not a structure having a threaded hole to be fabricated.

The invention therefore also relates to a novel monolayer machined metal structure that includes a threaded hole, which can be obtained by the process defined above.

The invention also relates to a process for fabricating in UV-LIGA technology a multilayer machined metal structure having entirely superposed layers, which comprises the following steps:

a) a bulk metal substrate is coated with a photoresist layer;
b) if necessary, the photoresist layer is heated in order to evaporate the solvent;

c) the photoresist layer is exposed to UV irradiation of 100 to 2000 mJ/cm$^2$ measured at a wavelength of 365 nm, through a mask corresponding to the desired impression;

d) if necessary, in order to complete the photocuring or the photodecomposition, the layer obtained after step c) is annealed;

e) development takes place by dissolving the uncured or photodecomposed parts;

f) a metal or an alloy is electrodeposited in the open parts of the photoresist mold;

g) leveling is carried out by machining, so as to obtain a plane upper surface;

h) steps a), b), c), d) and e) are repeated and that surface of the electroformed metal which is not covered with cured photoresist is activated by an electrochemical treatment;

i) steps f) and g) are repeated;

j) if necessary, steps h) and i) are repeated;

k) if necessary, one or more other machining operations are carried out on the upper face of the electroformed mechanical structure; and l) the metal structure and the cured photoresist are detached from the bulk metal substrate by delamination and the cured photoresist is separated from the multilayer machined metal structure having superposed layers.

The expression "multilayer having entirely superposed layers" means that, for two adjacent layers, the outline of the upper layer falls entirely within the vertical elevation of the outline of the lower layer.

Steps a), b), c), d), e), f) and g) are the same as those of the process described above for fabricating a monolayer metal structure by UV-LIGA.

Step h) consists in repeating steps a), b), c), d) and e) and in activating that surface of the electroformed metal which is not covered with cured photoresist by an electrochemical treatment.

Steps a), b), c), d) and e) are repeated using, in step a), as substrate, the plane upper surface obtained after step g) and, in step c) a new mask corresponding to the desired impression for the new electroformed metal layer.

That surface of the electroformed metal not covered with cured photoresist after repeating step e) is for example activated by applying a reverse current, making the electroformed metal act as anode, using techniques well known in the surface treatment art.

Step i) consists in repeating steps f) and g). A metal or an alloy is electrodeposited in the open part of the new cured photoresist mold obtained after repeating step e), and a machining leveling operation is carried out, in general by abrasion and polishing, so as to obtain a plane upper surface (with surface irregularities generally not exceeding about 1 µm). The metal or alloy electrodeposited during step i) may be identical to or different from the metal or alloy electrodeposited during step f). In general, it is the same metal or alloy.

Step j) consists, if necessary in order to obtain the desired multilayer metal structure, in repeating steps h) and i). This repetition is unnecessary in the case of fabricating a bilayer metal structure.

Step k) consists, if necessary in order to obtain the desired structure, in carrying out other machining operations on the upper face of the electroformed mechanical structure, such as for example beveling, etching or decorative machining.

Step l) consists in detaching the machined metal structure from the bulk metal substrate by delamination, and in separating the photoresist from the machined mechanical structure.

The lower face of the metal structure detached from the upper face of the bulk metal substrate reproduces the surface finish of said upper face. Thus, it will either be textured (if the upper face of the metal substrate is textured, for example by etching or micropeening) or have a polished appearance (if the upper face of the metal substrate has undergone a polishing operation). In the latter case, by examination with the naked eye, the polished appearance of the surface of the lower face of the structure cannot be distinguished from the polished appearance obtained where appropriate by polishing on the surface of the upper face. Under an optical microscope, with a magnification of 50 times, suitable illumination and a certain orientation, or under a scanning electron microscope or using topographic surface analysis systems, these two surfaces can however be distinguished.

The separation or stripping of the cured photoresist from the machined mechanical structure generally takes place by chemical etching or plasma treatment. The machined metal structure is thus freed.

The process for fabricating a multilayer metal structure having entirely superposed layers on a bulk metal substrate according to the invention has many advantages over the known processes for fabricating such structures on a silicon support wafer.

It allows any machining operation to be carried out on the upper surface of the metal structure obtained after the final electroforming step, before detachment from the substrate, especially a beveling, etching or decorative machining operation. Thus, it is possible, when fabricating a large number of structures (or parts) on any one substrate, for these structures positioned and immobilized on the substrate to be collectively machined, benefiting, for this machining, from the positioning and immobilization on extremely precise cured photoresist molds, carried out during execution of the UV-LIGA technique. It is very difficult to obtain such precision in the positioning and immobilization of each metal structure when this is detached.

The process of the invention includes a leveling step by machining (abrasion and polishing) at the end of each electrodeposition step so as to obtain a plane upper surface. This has the effect of improving the quality of the multilayer metal structure obtained and the regularity of its thickness, especially certain mechanical properties and/or appearance, since the subsequent electroplating takes place in a more regular manner and allows better thickness control on a polished surface than on a surface having irregularities.

A multilayer machined metal structure having entirely superposed layers that is novel and has advantageous properties is thus obtained.

The invention therefore also relates to the multilayer machined metal structure having entirely superposed layers that can be obtained by the process defined above.

The process of the invention also makes it possible, thanks to the use of a bulk metal substrate, to obtain novel multilayer metal structures having entirely superposed layers which include an inserted object or a threaded hole in the first electroformed layer, by carrying out the process in the same way as that described above in the case of the monolayer metal structures. Such multilayer structures that include an inserted object or a threaded hole cannot be obtained by the known processes for manufacturing multilayer metal structures by UV-LIGA that use a silicon support wafer.

The invention thus also relates to a multilayer machined metal structure having, in its first layer, an inserted object or a threaded hole that can be obtained by the process defined above.

Other features and advantages of the invention will become apparent on reading the following detailed description with reference to the appended drawings which illustrate, schematically and by way of example, a few methods of implementing the process of the invention.

In these drawings:

FIGS. 4A to 4H are sectional views showing schematically the various steps in the fabrication of the anchor of FIGS. 3A and 3B;

The following examples describe the fabrication of the return spring using the process of the invention, with reference to FIGS. 1 to 4H.

EXAMPLE 1

Fabrication of a Return Spring

Figure 1:
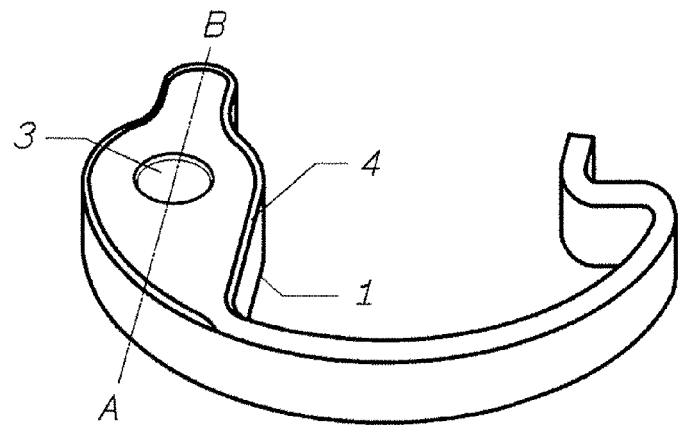
FIG. 1 is a perspective view of a return spring having a monolayer structure.

FIG. 1 shows a return spring 1, a cylindrical hole 3 and a beveled part 4.

Figure 2A:
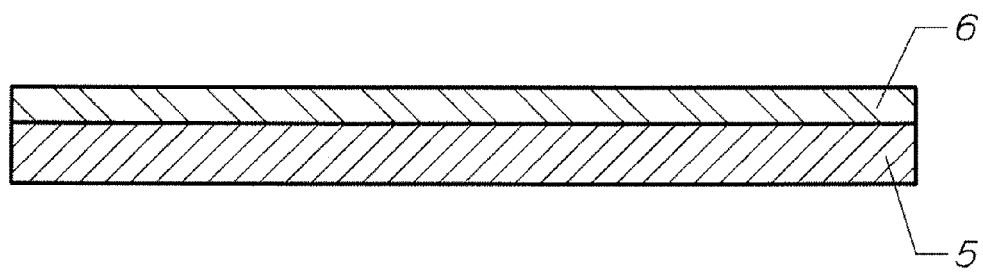
FIGS. 2A to 2F are sectional views on the line AB of FIG. 1, showing the various steps in the fabrication of the spring of FIG. 1.

FIG. 2A shows the structure obtained after step b) of the process of claim 2, which comprises a photoresist layer 6 covering the substrate 5. This structure was obtained using the protocol described below.

A substrate 5 formed from a stainless steel plate 1 mm in thickness and 150 mm in diameter was degreased and prepared for the electroforming, by degreasing with an alkaline solution, by neutralization with an acid solution, to passivate its surface, and then by rinsing with distilled water and drying. Next, a negative photoresist first layer, based on the octofunctional epoxy resin SU-8-2035 (Shell Chemical) with a thickness of 100 μm was deposited on the substrate 5 by spin coating, followed by heating, to evaporate the solvent, for 5 minutes at 65° C. and then 20 minutes at 95° C. Next, a second layer of the same photoresist with a thickness of 100 μm was deposited on the first photoresist layer by spin coating, followed by heating, to evaporate the solvent, for 5 minutes at 65° C. and then 45 minutes at 95° C.

Figure 2B:
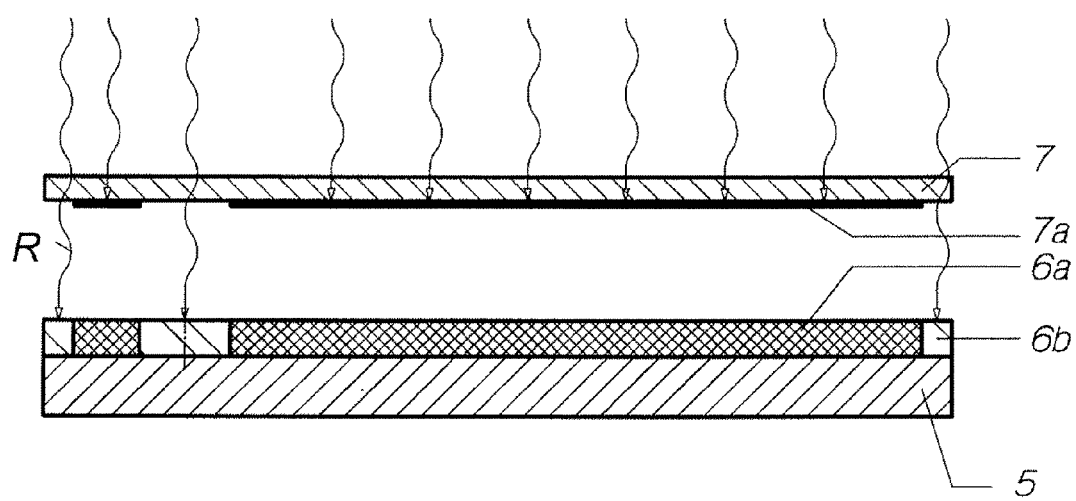

FIG. 2B corresponds to step c) of the process, with UV illumination of about 500 mJ/cm$^2$ centered on 365 nm of the photoresist through a mask corresponding to the desired impression. This figure shows the mask, comprising a UV-transparent support 7 and opaque zones 7a formed by chromium deposits. The same mask-forming support may have a large number of zones corresponding to as many structures as can be fabricated in a single batch, all the zones being obtained with very high resolution of the outline by photolithography, a technique well known in the microelectronics industry.

This UV irradiation R induces photocuring of the resin in the exposed zones 6b, the unexposed zones 6a remaining uncured.

Figure 2C:
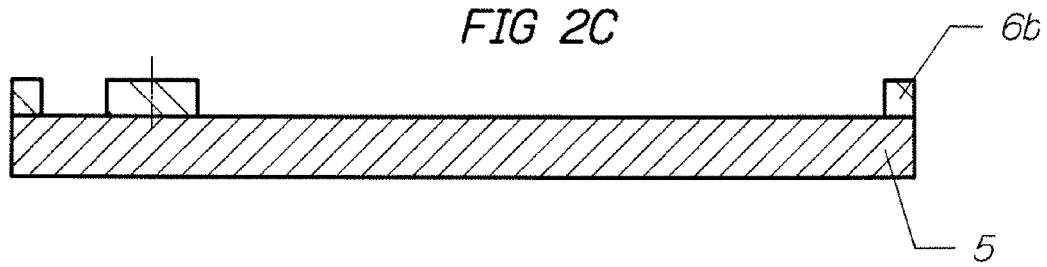

FIG. 2C shows the structure obtained after step e) of the process. The layer obtained after step c) was annealed, in order to complete the cure, for 1 minute at 65° C. followed by 15 minutes at 95° C., and then the unexposed photoresist was dissolved by passing it for minutes through three successive PGMEA baths (of increasing purity), rinsing in an isopropyl alcohol bath and drying. FIG. 2C shows the cured photoresist mold 6b superposed on the substrate 5.

Figure 2D:
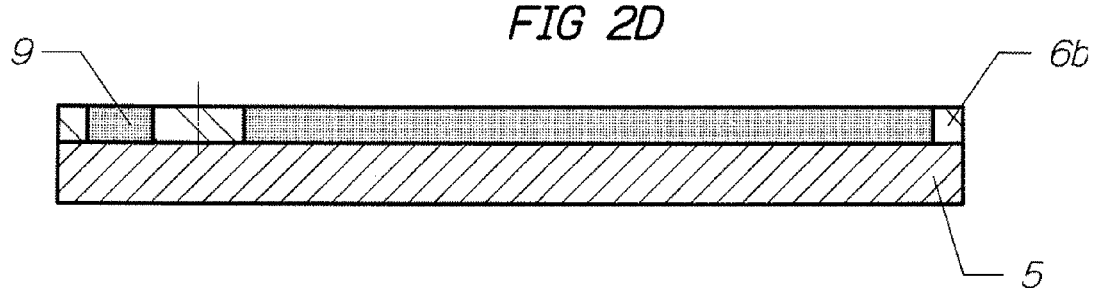

FIG. 2D shows the structure obtained following step f) of the process, after nickel electrodeposition, then leveling by abrasion and polishing so as to obtain a plane upper surface. This figure shows the cured resin mold 6b and the electroformed layer 9 that cover the substrate 5.

Figure 2E:
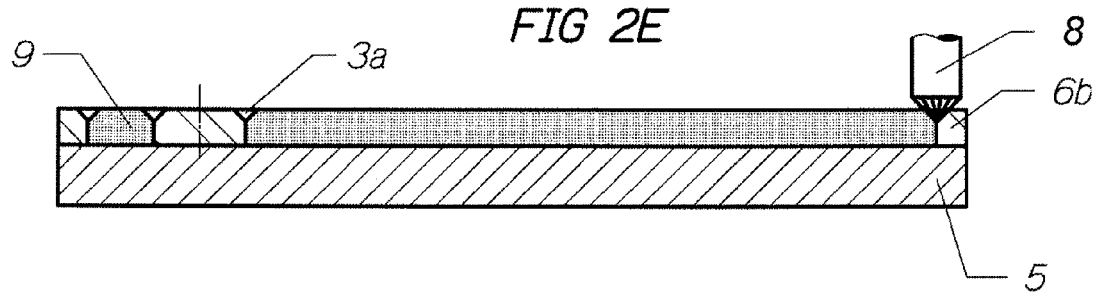

FIG. 2E shows the structure obtained during step h) of the process, during a beveling operation. This figure shows the substrate 5, the metal structure 9, the cured resin mold 6b, the beveled hole 3a and the milling cutter 8 used for the beveling.

Figure 2F:

FIG. 2F, which corresponds to the sectional view of FIG. 1, shows the spring obtained following step i) of claim 2, after detachment from the metal substrate by delamination and stripping of the cured photoresist with N-methylpyrrolidone.

EXAMPLE 2

Fabrication of an Escapement Anchor for a Watch Movement

Figure 3A:
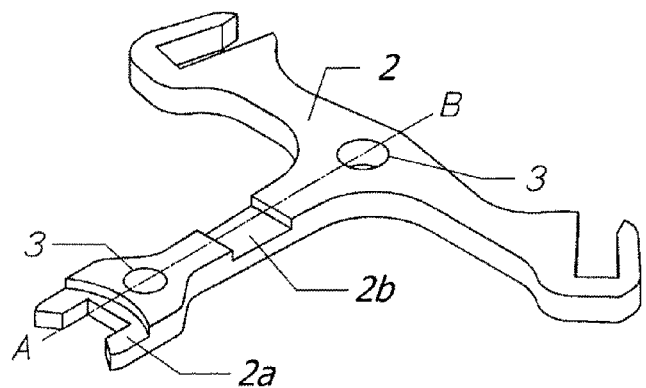
FIG. 3A is a perspective view from below and FIG. 3B is a sectional view on the line AB of FIG. 3A of an anchor for a watch movement escapement.
Figure 3B:
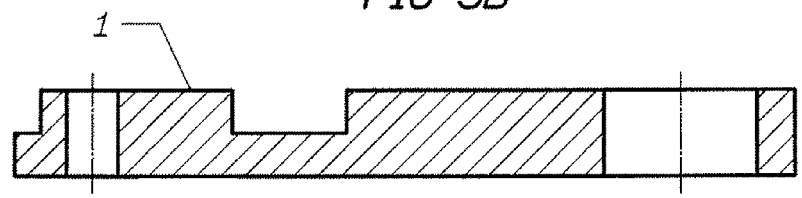

FIGS. 3A and 3B show an anchor comprising a cylindrical hole 3, a fork 2a and a recess 2b.

Figure 4A:
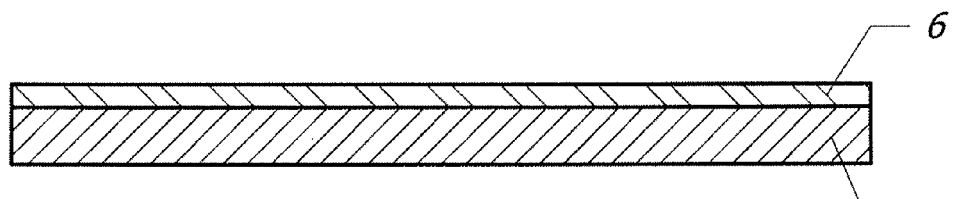

FIG. 4A shows the structure obtained following step b) of the process, which comprises a photoresist layer 6 covering the substrate 5. This structure was obtained using the protocol described below.

A substrate 5 formed from a stainless steel plate 1 mm in thickness and 150 mm in diameter was degreased and prepared for the electroforming, by degreasing with an alkaline solution, by neutralization with an acid solution, to passivate its surface, and then by rinsing with distilled water and drying. Next, a negative photoresist first layer, based on the octofunctional epoxy resin SU-8-2035 (Shell Chemical) with a thickness of 70 μm was deposited on the substrate 5 by spin coating, followed by heating, to evaporate the solvent, for 3 minutes at 65° C. and then 9 minutes at 95° C. Next, a second layer of the same photoresist with a thickness of 70 μm was deposited on the first photoresist layer by spin coating, followed by heating, to evaporate the solvent, for 5 minutes at 65° C. and then 35 minutes at 95° C.

Figure 4B:
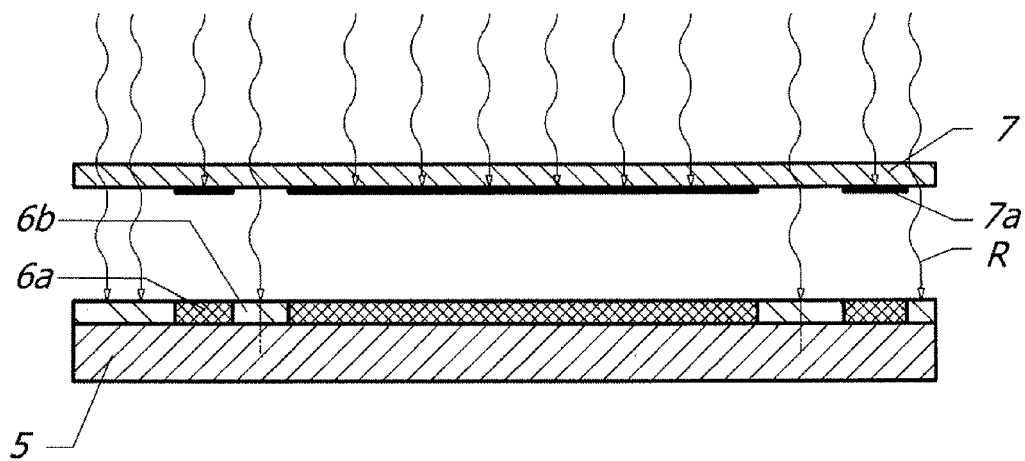
Figure 5A:
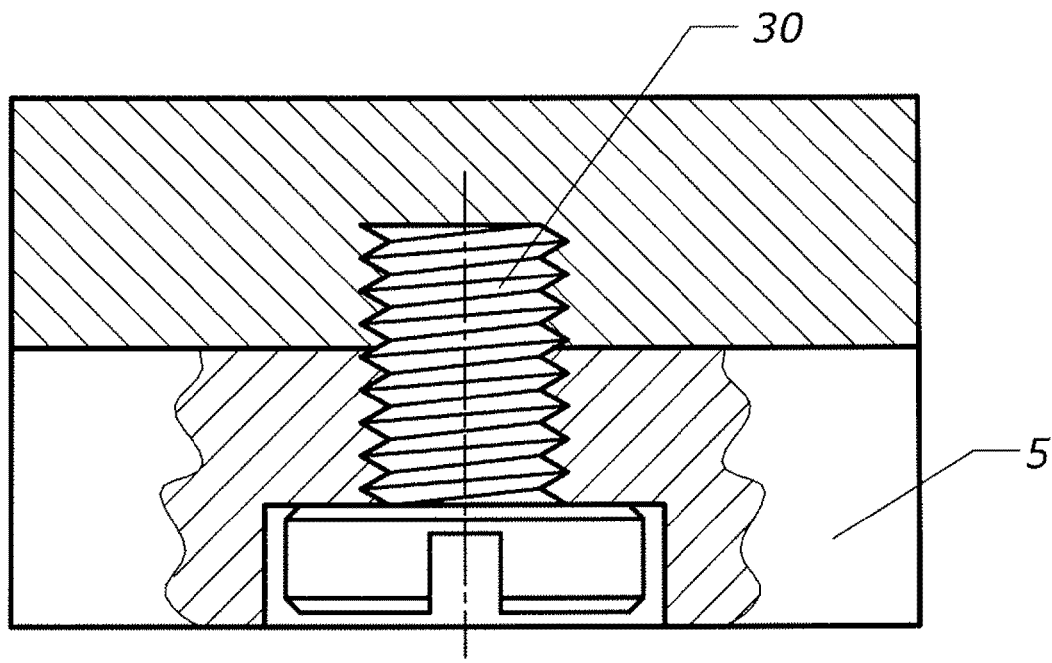
FIGS. 5A, 5B are partial sectional views of an assembly comprising a screw 30 in a tapped hole in the bulk metal substrate 5 in order to form a tapping in the electroformed structure.
Figure 5B:
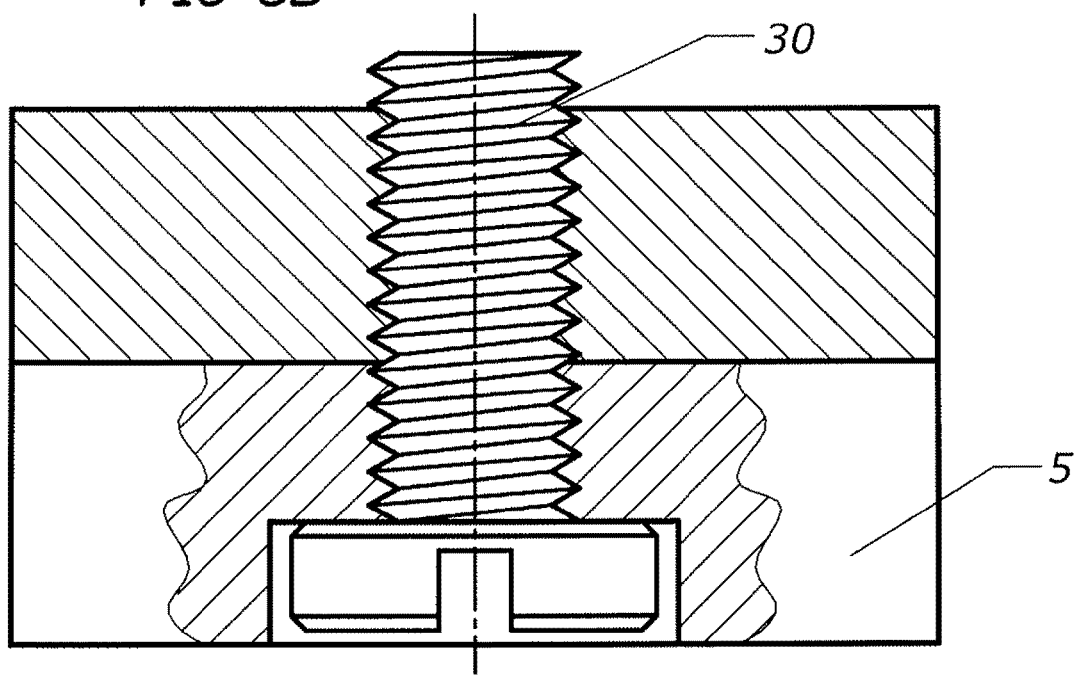

FIG. 4B corresponds to step c) of the process, with UV illumination of about 450 mJ/cm$^2$ centered on 365 nm of the photoresist through a mask corresponding to the desired impression. This figure shows the mask, comprising a UV-transparent support 7 and opaque zones 7a formed by chromium deposits. This UV irradiation R photocures the resin in the exposed zones 6b, the unexposed zones 6a remaining uncured.

FIG. 4C shows the structure obtained after step e) of the process. The layer obtained after step c) was annealed, in order to complete the cure, for 1 minute at 65° C. followed by 15 minutes at 95° C., and then the unexposed photoresist was dissolved by passing it for 15 minutes through three successive PGMEA baths (of increasing purity), rinsing in an isopropyl alcohol bath and drying. This figure shows the cured photoresist mold 6b on the substrate 5.

FIG. 4D shows the structure obtained after having carried out steps f) and g) of the process for electroplating nickel in the open parts of the cured photoresist mold and leveling, by abrasion and polishing, so as to obtain a plane upper surface, and having repeated steps a) and b) with two successive 50.mu.m layers of the same photoresist based on epoxy resin SU-8-2035, heating for 3 minutes at 65° C. then 6 minutes at 95° C., in the case of the first layer, and heating for 5 minutes at 65° C. then 20 minutes at 95° C., in the case of the second layer. FIG. 4D shows the second photoresist layer 11 covering the cured photoresist 6b and the electroformed layer 10, on top of the substrate 5.

FIG. 4E corresponds to the repetition of step c) of the process (during step h)), with UV illumination of about 400 mJ/cm² centered on 365 nm of the photoresist through a new mask corresponding to the desired impression. This figure shows the mask comprising a second UV-transparent support 12 and opaque zones 12a formed by chromium deposits. This UV irradiation R photocures the resin in the exposed zones 11b, the unexposed zones 11a remaining uncured.

FIG. 4F shows the structure obtained following the repetition of step e) of the process (during step h)). The layer obtained following the repetition of step c) was annealed, in order to complete the cure, for 1 minute at 65° C., then 15 minutes at 95° C., and then the unexposed photoresist was dissolved by passing through three successive PGMEA baths (of increasing purity) for 15 minutes, rinsing in an isopropyl alcohol bath and drying. This figure shows the second cured photoresist mold 11b on top of the first cured photoresist mold 6b and the electroformed metal layer 10, on top of the substrate 5.

FIG. 4G shows the structure obtained following the repetition of steps f) and g) of the process (during step i)). A second electroplating step was carried out with the same metal, namely nickel, in an amount slightly greater (10 to 30.mu.m) than the intended thickness, followed by leveling by abrasion and polishing so as to obtain a plane upper surface. This figure shows the second cured resin mold 11b and the second electroformed layer 13, on top of the first cured mold 6b and the first electroformed layer 10, on top of the substrate 5.

FIG. 4H, which corresponds to the sectional view of FIG. 3B, shows the anchor obtained following step 1) of the process, after the metal substrate has been detached by delamination and the cured photoresist has been removed by a plasma treatment.

Figure 6:
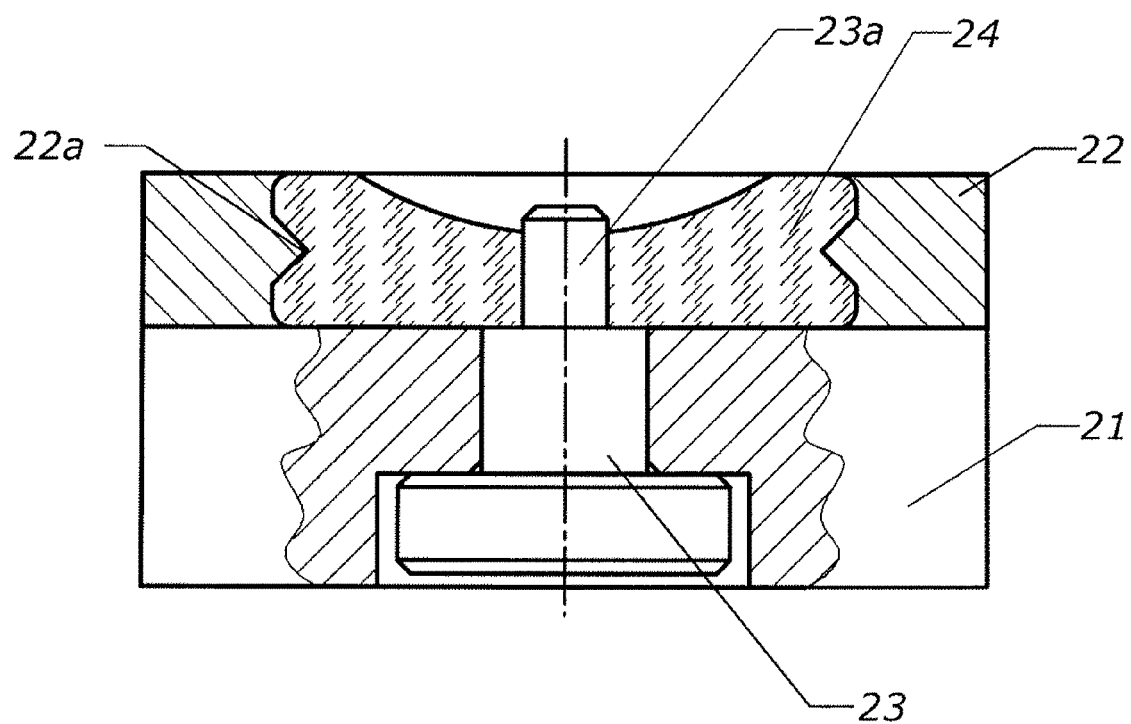
FIG. 6 is a partial sectional view showing how a bearing can be inserted into an electroformed metal layer.

FIG. 6 shows the removable positioning of an insert 24, consisting of a watch movement bearing jewel intended to be held captive in the metal layer 22 deposited by electroforming on the metal substrate 21. For this purpose, a positioning member 23 that terminates in a positioning peg 23a calibrated to the diameter of the hole in the jewel bearing 24, is forced into a positioning hole 1a in the substrate 21, making the peg 23a project beyond the surface of the substrate 21. The jewel may thus be positioned precisely and removably on the peg 23a. The lateral surface of the jewel 24 has a groove 24a so as to allow the metal deposited by electroforming to form an annular rib 22a for anchoring the bearing in the electroformed metal layer 22. The precision thus obtained is particularly high, since the jewel 24 is centered by its hole and not by its periphery. Furthermore, since the substrate 21 can be reused, it can be manufactured with extremely close tolerances.

The invention claimed is:

1. A process for fabricating simultaneously a plurality of monolayer or multilayer metal structures in LIGA technology, comprising, in sequence:
    depositing a photoresist layer on a flat bulk metal substrate,
    creating a plurality of photoresist molds by irradiation or electron or ion bombardment,
    electroplating a metal or alloy in these molds to form electroformed metal structures,
    carrying out one or more machining operations on the upper face of the electroformed metal structures,
    detaching the electroformed metal structures and the photoresist layer from the substrate, and
    separating the photoresist from these metal structures,
    wherein the bulk metal substrate on which the photoresist layer is deposited is a passivated bulk metal substrate for separating the metal structures and the photoresist from the bulk metal substrate by delamination,
    wherein a positioning member is fastened to the substrate before forming said electroformed metal structures, wherein the positioning member positions an insert on said substrate, wherein said insert is removably associated with said positioning member,
    wherein said positioned insert becomes attached to said electroformed metal structures when said electroformed metal structures are formed, and
    wherein the electroformed metal structures are detached from the substrate together with said insert attached to the metal structures and the photoresist layer, so that the obtained metal structures have the positioned insert attached thereto.

2. The fabrication process as claimed in claim 1, which comprises the following steps:
    a) coating a bulk metal substrate with a photoresist layer;
    c) exposing the photoresist layer to UV irradiation of 100 to 2000 mJ/cm² measured at a wavelength of 365 nm, through a mask corresponding to the desired impression;
    e) carrying out development by dissolving the uncured or photodecomposed parts;
    f) electrodepositing a metal or an alloy in the open parts of the photoresist mold,
    g) levelling the electroformed metal structures by machining, so as to obtain a plane upper surface;
    i) detaching the metal structures and the cured photoresist, by delamination from the bulk metal substrate, then separating the cured photoresist from the machined metal structures,
    wherein the positioned insert is fastened to the substrate after steps a) to e).

3. The process as claimed in claim 2 for fabricating a multilayer machined metal structure having entirely superposed layers in UV-LIGA technology, which comprises the following steps:
    a) coating a bulk metal substrate with a photoresist layer;
    c) exposing the photoresist layer to UV irradiation of 100 to 2000 mJ/cm² measured at a wavelength of 365 nm, through a mask corresponding to desired impression;
    e) carrying out development by dissolving uncured or photodecomposed parts;
    f) electrodepositing a metal or an alloy is electrodeposited in open parts of the photoresist mold,
    wherein:
    g) levelling the electroformed metal structures by machining, so as to obtain a plane upper surface;
    h) repeating steps a), c), and e) and activating that surface of the electroformed metal which is not covered with cured photoresist;
    i) repeating steps f) and g);
    l) detaching the metal structures and the cured photoresist from the bulk metal substrate by delamination from the bulk metal substrate, then separating the cured photoresist from the multilayer electroformed metal structures having superposed layers.

4. The process as claimed in claim 1, in which the metal substrate is made of stainless steel.

5. The process as claimed in claim 1, in which the surface of the substrate is worked by micropeening, chemical or mechanical etching, or by a laser so as to obtain the negative of a finished surface of the electroformed metal structures.

6. The process as claimed in claim 1, in which the metal substrate has an upper face polished to the degree of polishing desired for the adjacent face of said electroformed metal structures.

7. The process as claimed in claim 2, in which, after the metal structures and the cured photoresist have been detached, etching, surface treatment and mechanical or laser marking operations are carried out on the detached metal structures.

8. The fabrication process as claimed in claim 2, which further comprises the following step:
b) heating the photoresist layer in order to evaporate the solvent.

9. The fabrication process as claimed in claim 2, which further comprises the following step:
d) annealing the layer obtained after step c) in order to complete the photocuring or the photodecomposition.

10. The fabrication process as claimed in claim 3, which further comprises the following step:
b) heating the photoresist layer in order to evaporate the solvent.

11. The fabrication process as claimed in claim 3, which further comprises the following step:
d) annealing the layer obtained after step c) in order to complete the photocuring or the photodecomposition.

12. The process as claimed in claim 3, which further comprises the following steps:
j) repeating steps h) and i).

13. The fabrication process as claimed in claim 2, which further comprises the following step:
after detaching the metal structures and the cured photoresist from the bulk metal substrate by delamination and before separating the cured photoresist from the machined structures, carrying out at least one etching, surface-treatment, mechanical or laser marking operation on the detached metal structures.

14. The fabrication process as claimed in claim 3, which further comprises the following step:
after detaching the metal structures and the cured photoresist from the bulk metal substrate by delamination and before separating the cured photoresist from the machined multilayer structures, carrying out at least one etching, surface-treatment, mechanical or laser marking operation on the detached metal structures.

15. The fabrication process as claimed in claim 1, which further comprises the following step:
passivating the bulk metal substrate before depositing the photoresist layer.

16. The fabrication process as claimed in claim 15, wherein the bulk metal substrate is passivated by alkaline degreasing followed by acid neutralization.

17. The fabrication process as claimed in claim 1, wherein the bulk metal substrate has been passivated by alkaline degreasing followed by acid neutralization.

18. A process for fabricating simultaneously a plurality of monolayer or multilayer metal structures in LIGA technology, comprising, in sequence:
depositing a photoresist layer on a flat bulk metal substrate,
creating a plurality of photoresist molds by irradiation or electron or ion bombardment,
electroplating a metal or alloy in these molds to form electroformed metal structures,
carrying out one or more machining operations on the upper face of the electroformed metal structures,
detaching the electroformed metal structures and the photoresist layer from the substrate, and
separating the photoresist from these metal structures,
wherein the bulk metal substrate on which the photoresist layer is deposited is a passivated bulk metal substrate for separating the metal structures and the photoresist from the bulk metal substrate by delamination,
wherein a screw is placed in at least one tapped hole made through the metal substrate before the electroformed metal structures are formed, so that a portion of the screw extends beyond the surface of the substrate,
wherein the electroformed metal structures are formed directly surrounding the portion of the screw extending beyond the surface of the substrate, and
wherein, before detaching the metal structures and the cured photoresist from the metal substrate, the screw is unscrewed, so that the metal structures have at least one threaded hole formed therein.

19. The fabrication process as claimed in claim 18, which comprises the following steps:
a) coating a bulk metal substrate with a photoresist layer;
c) exposing the photoresist layer to UV irradiation of 100 to 2000 mJ/cm$^2$ measured at a wavelength of 365 nm, through a mask corresponding to the desired impression;
e) carrying out development by dissolving the uncured or photodecomposed parts;
f) electrodepositing a metal or an alloy in the open parts of the photoresist mold,
g) levelling the electroformed metal structures by machining, so as to obtain a plane upper surface;
i) detaching the metal structures and the cured photoresist, by delamination from the bulk metal substrate, then separating the cured photoresist from the machined metal structures,
wherein the screw is placed in the at least one tapped hole made through the metal substrate after steps a) to e).

20. The process as claimed in claim 19 for fabricating a multilayer machined metal structure having entirely superposed layers in UV-LIGA technology, which comprises the following steps:
a) coating a bulk metal substrate with a photoresist layer;
c) exposing the photoresist layer to UV irradiation of 100 to 2000 mJ/cm$^2$ measured at a wavelength of 365 nm, through a mask corresponding to desired impression;
e) carrying out development by dissolving uncured or photodecomposed parts;
f) electrodepositing a metal or an alloy is electrodeposited in open parts of the photoresist mold,
wherein:
g) levelling the electroformed metal structures by machining, so as to obtain a plane upper surface;
h) repeating steps a), c), and e) and activating that surface of the electroformed metal which is not covered with cured photoresist;
i) repeating steps f) and g);
l) detaching the metal structures and the cured photoresist from the bulk metal substrate by delamination from the bulk metal substrate, then separating the cured photoresist from the multilayer electroformed metal structures having superposed layers.

21. The fabrication process as claimed in claim 1, wherein the insert is a bearing.

* * * * *